United States Patent
Birger

(10) Patent No.: US 6,519,152 B1
(45) Date of Patent: Feb. 11, 2003

(54) YARN PROCESSING SYSTEM

(75) Inventor: Johansson Birger, Ulricehamn (SE)

(73) Assignee: Iropa AG, Baar (CH)

( * ) Notice: Subject to any disclaimer, the term of this patent is extended or adjusted under 35 U.S.C. 154(b) by 0 days.

(21) Appl. No.: 09/720,835

(22) PCT Filed: Jul. 8, 1999

(86) PCT No.: PCT/EP99/04820

§ 371 (c)(1),
(2), (4) Date: Mar. 6, 2001

(87) PCT Pub. No.: WO00/03575

PCT Pub. Date: Jan. 20, 2000

(30) Foreign Application Priority Data

Jul. 8, 1998 (DE) .......................... 198 30 576

(51) Int. Cl.⁷ .................................. H05K 7/20
(52) U.S. Cl. .................. 361/704; 361/702; 361/707; 257/706; 257/709; 174/16.3
(58) Field of Search ................. 361/702–707, 361/713–724, 726–727, 807, 810; 257/706–727, 52.2, 52.3; 174/16.3; 165/80.1, 80.2, 80.3, 80.4, 165, 185; 24/295, 457, 456, 530, 531, 568, 570; 411/516, 520, 522; 267/160, 164

(56) References Cited

U.S. PATENT DOCUMENTS

| 4,132,368 A | | 1/1979 | Schiess et al. |
| 4,563,725 A | * | 1/1986 | Kirby ........................... 361/388 |
| 4,692,840 A | * | 9/1987 | Ellis ............................ 361/393 |
| 5,262,922 A | * | 11/1993 | Yamaji et al. ................ 361/720 |
| 5,461,541 A | * | 10/1995 | Wentland et al. ............ 361/707 |
| 5,648,889 A | * | 7/1997 | Bosli ............................ 361/704 |
| 5,812,375 A | | 9/1998 | Casperson |

FOREIGN PATENT DOCUMENTS

| DE | 2651857 | 5/1978 |
| EP | 0116396 | 8/1984 |

* cited by examiner

Primary Examiner—Darren Schuberg
Assistant Examiner—Michael Datskovsky
(74) Attorney, Agent, or Firm—Flynn, Thiel, Boutell & Tanis, P.C.

(57) ABSTRACT

A yarn processing system, e.g. a yarn feeder comprising a housing in which at least one semiconductor component is arranged on a printed circuit board. The semiconductor component lies on a heat conducting body which is in the form of at least one prolongation of the housing that extends through the printed circuit board up to the semiconductor component.

11 Claims, 1 Drawing Sheet

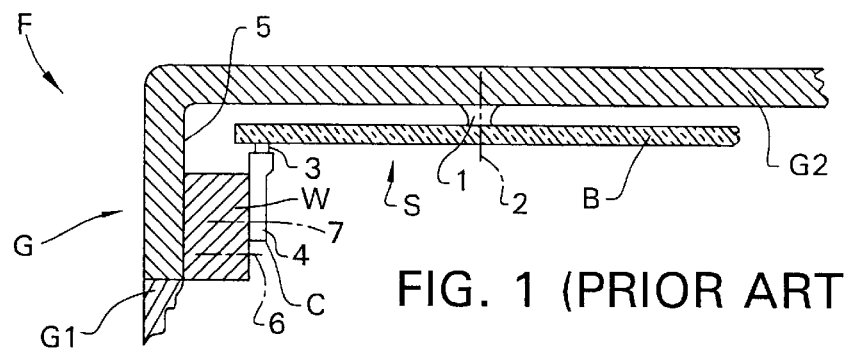
FIG. 1 (PRIOR ART)
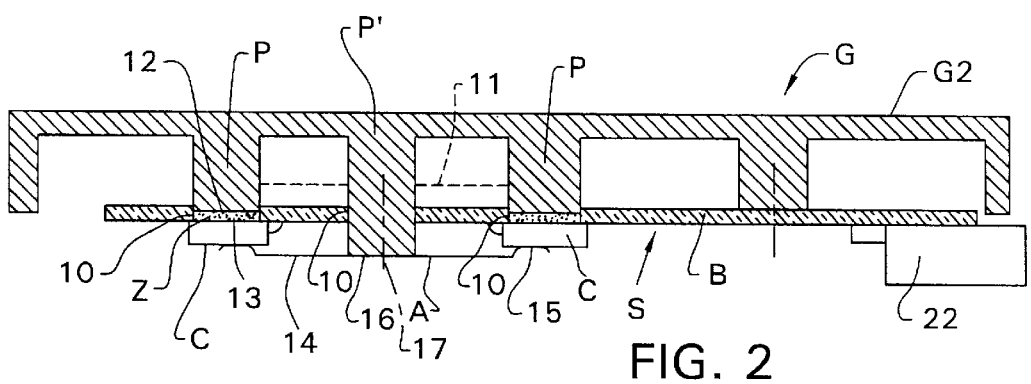
FIG. 2
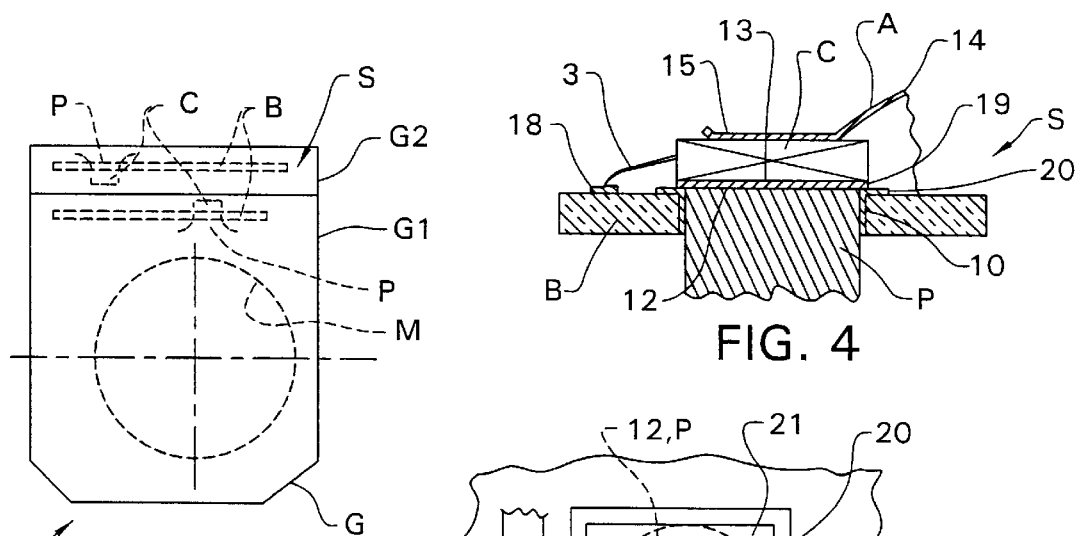
FIG. 3
FIG. 4
FIG. 5

YARN PROCESSING SYSTEM

FIELD OF THE INVENTION

The present invention relates to a yarn processing system

BACKGROUND OF THE INVENTION

Yarn processing systems, which the invention refers to, may be not only yarn feeders, but e.g. also accessory devices used for yarn processing that supply textile machines, such as weaving or knitting machines, with yarn and comprise at least one electrically driven component and a control circuit assigned thereto. Apart from yarn feeders, such devices may be yarn impregnating means or yarn lubricators, controlled yarn brakes and yarn tensioners, slip-type conveyors for yarn, rotary drives for yarn supply coils, or the like. The control circuit may be positioned in the housing of the yarn feeder or the accessory device, or in a separate housing of the yarn feeder or the accessory device, or in a separate housing which, nevertheless, has to be regarded as part of the yarn processing system.

In a yarn feeder known from DE-C-265 18 57, the control circuit of the drive motor comprises effect transistors as semiconductor components. The control circuit is normally arranged in the housing, with the effect transistors being positioned on the printed circuit board. During operation the semiconductor components generate heat which during prolonged operation leads to a relatively high heat level that impairs the service life of the control circuit, in particular of the semiconductor components.

In yarn feeders it is known from prior use in practice (FIG. 1) that heat-generating semiconductor components, such as effect transistors, are positioned on the edge portion of the printed circuit board and that a strip-like heat conducting body is mounted in the housing or on the printed circuit board in the vicinity of the semiconductor components, with portions of the semiconductor components being pressed against said heat conducting body by clamping elements. The heat conducting body, in turn, is mounted in heat transmitting contact with the housing.

This is troublesome from a constructional point of view and, with respect to the equipment of the printed circuit board, requires inexpedient upright positions of the semiconductor components because the latter must project upwards from their bondings with the printed circuit board to contact the heat conducting body. Moreover, contact with the heat conducting body is established some distance away from the hottest portion of the semiconductor component which normally lies near the bondings and thus radiates a lot of heat into the environment, said heat being not absorbed by the heat conducting body. The inexpensive so-called "surface mounting", e.g. by assembling robots, can therefore not be employed for said semiconductor components. In this expedient mounting technique, semiconductor components are secured in a lying position with one of their surfaces to an adhesive surface of the printed circuit board, i.e. either in addition to the bondings or even for creating a bonding or grounding.

It is known from EP-A-0 116 396 that electronic subassemblies which can be stacked one upon the other are each designed such that two rigid plates consisting of heat-conducting metal clamp a printed circuit board with semiconductor components arranged thereon between themselves. The two outer plates are urged together by C-clips provided at the edge side or by clamping screws. At least one plate has provided thereon projections which extend through openings into the printed circuit board from below up to the semiconductor components. Since the plates substantially correspond to the printed circuit board in size, their heat absorbing capacity is limited.

US-5-A-812 375, which is of an older time rank, suggests an electronic subassembly which consists of at least one printed circuit board equipped with semiconductor components and of an encapsulation consisting of two shells, the base of the encapsulation consisting of heat conducting material and comprising at least one projection that projects into an opening of the printed circuit board up to the neighborhood of an insulating layer carrying a semiconductor component to be cooled. Said encapsulated subassembly forms a unit in which the base of the encapsulation has only a limited heat absorbing capacity.

It is the object of the present invention to provide a yarn processing system of the above-mentioned type in which a low temperature level can be obtained in the control circuit in a constructionally simple, inexpensive and space-saving way, optionally even by applying the surface mounting technique for the semiconductor components.

Heat generated by the semiconductor component is dissipated in a highly efficient manner by physical heat transmission through the printed circuit board into the housing or housing part. The projection can easily be shaped during formation of the housing. The semiconductor component is cooled in a particularly expedient manner near the bondings, i.e. near the place of origin of heat, because the prolongation can extend through the printed circuit board to the place of origin. Heat accumulation between the semiconductor component and the printed circuit board is also avoided because a physical heat conducting path is created, extending from the semiconductor component into the housing. The temperature of the semiconductor component and the control circuit can thereby be reduced considerably, which is of benefit to operational safety and to the service life of the control circuit. The housing may be the housing of the yarn feeder or of an accessory device, which as the housing of the yarn processing device has a very high heat absorbing capacity thanks to its size and mass.

The prolongations forming the heat dissipating body are e.g. block- or pin-shaped, which is simple with respect to technical production, and are integral with the housing or housing part. The prolongations can already be realized during formation of the housing or housing part, which will considerably simplify assembly at a later time. The prolongation expediently penetrates through an opening or cutout of the printed circuit board, which has specifically been formed for said purpose, the prolongation engaging into the opening or cutout in a relatively accurately fitting manner or with a play on all sides. In the case of large semiconductor components several prolongations could perform a joint cooling action.

An intermediate material which is inserted between the semiconductor component and the prolongation and which is suitably elastic at least to some extent improves heat dissipation, for it may be difficult to achieve full contact between hard or metallic surfaces. The intermediate material is capable of compensating for wrong positions caused by the production process or thermally between the heat dissipating surfaces.

Suitably, the intermediate layer is an electrically insulating pad (e.g. gap pad) of a highly heat-conducting material, an adhesive or filler coat (e.g. silicone plastics), or a flexible carrier impregnated with an adhesive agent (e.g. a self-adhesive insulating tape.

Thanks to the prolongation which for cooling purposes extends through the printed circuit board to the semiconductor component (with or without intermediate layer), the semiconductor component to be cooled can advantageously be mounted according to the so-called surface mounting technique on the printed circuit board, i.e. in an automatic mounting device and/or with assembly robots.

Advantageously, the semiconductor component is acted upon by an abutment at the side opposite to the prolongation. This is of advantage for various reasons.

The abutment can produce a force equilibrium in a non-positive manner with the prolongation pressing against the semiconductor components, so that the connection portion of the semiconductor component with the printed circuit board or the bondings is not subjected to any undesired loads. Moreover, the contact pressure between prolongation and semiconductor component can be adjusted by means of the abutment. Finally, the printed circuit board can be positioned and secured in its position within the housing or a housing part by means of the abutment at the same time, so that the number of fastening points for the printed circuit board can be reduced and further fastening points are no longer needed. The abutment may be a positive positioning member for the semiconductor component.

When the abutment is also secured to a holding prolongation of the housing, all forces are received by the housing without any undue load on the printed circuit board or the semiconductor component.

The abutment may be a spring element preferably with adjustable contact pressure, to obtain the above-mentioned equilibrium of forces and to secure the printed circuit board in its position. For instance, the spring element is fixed in abutment against its holding block, so that the hold-down force can be predetermined in an accurate way.

It is advantageous with respect to the mounting technique when a joint abutment is assigned to a plurality of semiconductor components.

As stated, the prolongations define a holding device for printed circuit boards together with the abutment so that further fastening points and mounting steps are not required for fixing the printed circuit board as soon as the mounting steps for cooling have been taken.

In a simple production technique the prolongations are e.g. block- or pin-shaped and integral with the housing or housing part. The prolongations can already be realized during shaping of the housing or housing part, which considerably simplifies the later mounting process.

For achieving an efficient heat transfer during heat dissipation the end faces of the prolongations should be machined. Optionally, the end faces are even adapted to the contours of the semiconductor components in the support area.

A plurality of prolongations of the housing, which serve cooling purposes, may be interconnected by connection webs or contained in a joint base to use a mass which is as large as possible for cooling and heat distribution, respectively, over a short distance.

When a support shoulder for the printed circuit board is provided on at least one of the prolongations, it is easy to position the printed circuit board and to secure the same in its position.

BRIEF DESCRIPTION OF THE DRAWINGS

A conventional embodiment and embodiments of the subject matter of the invention will now be explained with reference to the drawing, in which:

FIG. 1 shows a partial section of a conventional cooling structure (prior art);

FIG. 2 is a section through an embodiment of a cooling structure according to the invention for a yarn processing system, e.g. a yarn feeder;

FIG. 3 is a schematic front view of the yarn feeder;

FIG. 4 is an enlarged detail section of the embodiment of a cooling structure according to the invention; and FIG. 5 is a top view of FIG. 4.

DETAILED DESCRIPTION

FIG. 1 illustrates a conventional cooling structure for a yarn processing system F, as can be found in yarn feeders F that are available on the market. The yarn feeder F comprises a housing G of metallic material (light metal, light metal alloy, diecasting, zinc diecasting, or the like) which is e.g. composed of a basic housing G1 and a covering housing part G2. A printed circuit board B which is at least equipped with semiconductor components C (effect transistors, processors, or the like) is secured to bearings 1 of the housing part G2 by means of fastening elements 2. The semiconductor components C are connected near the edge portion of the printed circuit board B with bondings 3, but are mounted such that they project upwards with their bodies 4 from the printed circuit board B. A strip-like heat transfer body W, e.g. of metal, is secured to the inside of the housing part G2 by means of fastening elements 6, so that a physical heat dissipation takes place between the heat conducting body W and the housing part G2. The bodies 4 of the semiconductor components C are clamped with fastening elements 7 against the heat transfer body W for contact with the latter so as to transmit arising heat into the heat conducting body W.

FIG. 2 illustrates a section through a cooling structure of the invention for semiconductor components C (effect transistors, processors, or the like) of a control circuit 5 of a yarn feeder F of a yarn processing system. The printed circuit board B which is equipped with the semiconductor component C is mounted on the housing part G2 of the housing G. The control circuit S could also be arranged in a housing which is separated from the yarn processing device and equipped with said cooling structure.

Each of the semiconductor components C is connected via its bonding 3 to conductors (not shown) of the printed circuit board B and rests with one (13) of its surfaces next to the printed circuit board B or on said board. In the area of the semiconductor components C the printed circuit board B is provided with a continuous opening 10 (or with a cutout which is open towards the edge portion, not shown) into which a prolongation P (e.g. in the form of a pin, block, truncated cone or truncated pyramid), which is made integral with the housing part G2, engages such that its end surface 12 directly contacts the surface 13 of the semiconductor component C, or (as shown) by the agency of a highly heat-conducting intermediate material Z. The intermediate material Z is e.g. an electrically insulating, highly heat-conducting pad (e.g. a gap pad), or an adhesive or filler coat, or an elastic carrier impregnated with an adhesive agent. The intermediate material Z may be elastic to some extent and suitably have adhesive properties on both surfaces 12, 13 for improving heat transition. However, it is also certainly possible to place the end face 12 directly on the end face 13, e.g. if full contact can be ensured by processing the end face 12 and a matching surface 13 of the semiconductor component C and, possibly, if grounding or bonding is to be effected by said contact.

Furthermore, holding prolongations P' are integrated into the housing part G2. One of the holding prolongations P' serves to fix an abutment which acts on the semiconductor components C in a positive and/or non-positive manner in a sense opposite to the contact pressure of the prolongations P. Abutment A may be a spring element 14 which together with a plurality of end portions 15 acts on a plurality of semiconductor components C and is fixed in a fastening portion 16 by means of a fastening element 17 to the prolongation P'. The elastic contact pressure of each end portion 15 is adjustable, e.g. by clamping the fastening portion 16 in abutment with the holding prolongation P'. The holding prolongation P' also extends through an opening of the printed circuit board B. The abutment A may also be a positive positioning stop for one or more semiconductor components C.

A further holding projection P' of the housing part G2 can additionally be used for fixing the printed circuit board B, for instance in the vicinity of a connection body 22, above all for the reason that during use of the connection body 22 (connection or disconnection of an electrical connection) forces are introduced into the printed circuit board B that will then be received by the holding prolongation P'.

The prolongations P, at least one holding prolongation P', and the abutment A can jointly define a mounting device for the printed circuit board B, so that no further fastening means are needed, but the printed circuit board B will be fixed in its position in a proper way as soon as the constructional prerequisites for cooling the semiconductor components C have been met.

FIG. 3 shows that the printed circuit board B may be mounted either in the housing part G2 or in the housing part G1. The semiconductor components C may be oriented on the printed circuit board B in the housing part G2 towards the housing part G1, and be oriented on the printed circuit board B in the housing part G1 towards the housing part G2. Each of the prolongations P extends through the printed circuit board B for cooling purposes. FIG. 3 also shows in broken line the motor M which is contained in the housing part G1 and controlled via the control circuit arranged on the printed circuit board B. The respective circuit board B could also be laid on edge or arranged in inclined upright fashion in housing G. In this case, too, at least one prolongation extends through the printed circuit board to the semiconductor component to be cooled. When the control circuit S (not shown) is contained in a housing of its own, the cooling structure is integrated into said housing.

As outlined in FIG. 2, the semiconductor component C is mounted according to the so-called "surface mounting technique" on the printed circuit board B. FIGS. 4 and 5 illustrate a variant of said mounting technique which can be used at low costs in substantially automated or robot-equipped mounting devices.

In FIGS. 4 and 5 the printed circuit board B has provided thereon a planar adhesive portion 20 (of metal) which is either only needed for an adhesive function of the semiconductor component C, or also for establishing a bonding (e.g. grounding or another bonding equivalent to the bonding 13 with the conductor 18). The semiconductor component C is provided on its surface 13 with a metallic layer 19 which is connected to the adhesive portion 20 for fixing the semiconductor component C to the printed circuit board B (in addition to bonding 3) during equipment of the printed circuit board B. A further fastening of the semiconductor component C is then no longer needed.

The opening 10 through the printed circuit board B, which is intended for the action of the prolongation P as a heat conducting body W, extends either up to the adhesive portion 20 or through the adhesive portion 20 for reasons of production techniques, so that the end face 12 of the prolongation P will then directly rest on the metal layer 19 to carry off heat. Optionally, an intermediate material Z, which is shown in FIG. 2, is provided between the end face 12 and the metal layer 19 on the surface 13 to improve heat transfer. Abutment A rests with its end portion 25 on the upper side of the semiconductor component C that is facing away from prolongation P.

Although particular preferred embodiments of the invention have been disclosed in detail for illustrative purposes, it will be recognized that variations or modifications of the disclosed apparatus, including the rearrangement of parts, lie within the scope of the present invention.

In FIG. 5 the adhesive portion 20 extends over the e.g. quadrangular outer contour of the semiconductor component C to the outside. Since opening 10 is a round bore and since prolongation P has also a round end face, sufficiently large surfaces are obtained in the corner portions 21 for adhesion of the semiconductor component C in the adhesive portion 20 (surface mounting), and heat generated near the surface 13 in the semiconductor component C is nevertheless efficiently carried off through the printed circuit board B.

What is claimed is:

1. In a yarn feeder including a housing of heat-conducting material, in which at least one semiconductor component that generates heat during operation is arranged with bondings on a printed circuit board of a control circuit of a control unit, said semiconductor component dissipating heat to at least one heat conducting body of said housing receiving the control unit, comprising the improvement wherein said heat conducting body comprises at least one prolongation which is integrally and unitarily formed with said housing or a housing part and extends, starting from said housing or said housing part of said yarn feeder, through an opening penetratingly formed in said printed circuit board, and through said printed circuit board up to said semiconductor component.

2. The yarn feeder according to claim 1, wherein a heat-conducting intermediate material in the form of an electrically insulating pad is arranged between said semiconductor component and said prolongation and is in surface contact with said prolongation and said semiconductor component.

3. The yarn feeder according to claim 1, wherein said semiconductor component is mounted according to the surface mounting method with one of its surfaces on an adhesive portion provided on said printed circuit board, and said prolongation extends through said printed circuit board to said adhesive portion or through said adhesive portion to the surface of said semiconductor component.

4. The yarn feeder according to claim 1, wherein said semiconductor component is acted upon in a non-positive and/or positive manner by an abutment disposed opposite to said prolongation, said abutment being arranged on a holding prolongation of said housing or housing part of said yarn feeder, which holding prolongation extends through said printed circuit board from one side to the other.

5. The yarn feeder according to claim 4, wherein said abutment is a spring element with an adjustable contact pressure, or a positive positioning element.

6. The yarn feeder according to claim 1, wherein said printed circuit board is secured in position by means of a holding device jointly formed by said at least one prolongation and an abutment of said housing of said yarn feeder.

7. A yarn feeder comprising:
a housing constructed of heat conducting material, said housing defining an outwardly projecting mounting part which is a unitary and integral component of said housing; and
a control circuit disposed in said housing and including a circuit board defining an opening therein, and a semiconductor component fixed to said circuit board adjacent said opening, said mounting part projecting into said opening and an outer end of said mounting part being disposed in heat transferring relation with the semiconductor component to provide a physical heat conducting path from said semiconductor component directly to said housing.

8. The yarn feeder of claim 7 wherein said circuit board defines a plurality of openings therein, and said housing defines a pair of said mounting parts which are first mounting parts and project into corresponding first openings defined in said circuit board and a second mounting part disposed between said first mounting parts, said second mounting part projecting through a second one of said openings in said circuit board disposed between said first openings, a pair of semiconductor components are fixed to said circuit board adjacent the respective first openings, and a spring element is attached to said second mounting part and has a pair of end portions which respectively apply pressure to said semiconductor components on sides thereof opposite the respective first mounting parts.

9. The yarn feeder of claim 8 wherein a central region of said spring element is fixed to said second mounting part, and said end portions project in opposite directions from said central region.

10. The yarn feeder of claim 7 wherein a heat conducting intermediate material is disposed between said semiconductor component and said prolongation to provide maximum surface contact therebetween.

11. The yarn feeder of claim 10 wherein said intermediate material comprises an electrically insulating pad.

* * * * *